(12) United States Patent
Utsumi

(10) Patent No.: US 8,487,299 B2
(45) Date of Patent: Jul. 16, 2013

(54) ORGANIC EL DEVICE AND METHOD OF MANUFACTURING SAME

(75) Inventor: Makoto Utsumi, Nagano (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 274 days.

(21) Appl. No.: 12/672,996

(22) PCT Filed: Sep. 26, 2008

(86) PCT No.: PCT/JP2008/067542
§ 371 (c)(1),
(2), (4) Date: May 26, 2011

(87) PCT Pub. No.: WO2010/035337
PCT Pub. Date: Apr. 1, 2010

(65) Prior Publication Data
US 2011/0278547 A1    Nov. 17, 2011

(51) Int. Cl.
*H01L 35/24*    (2006.01)

(52) U.S. Cl.
USPC ............... 257/40; 257/E51.001; 438/99

(58) Field of Classification Search
USPC ............... 257/40, E51.001; 438/99
See application file for complete search history.

(56) References Cited

U.S. PATENT DOCUMENTS

| | | | |
|---|---|---|---|
| 2003/0071567 A1 | 4/2003 | Eida et al. | |
| 2005/0231106 A1 | 10/2005 | Tanaka et al. | |
| 2005/0263775 A1 | 12/2005 | Ikeda et al. | |
| 2007/0164666 A1 | 7/2007 | Oosono et al. | |
| 2007/0228944 A1 | 10/2007 | Oosono et al. | |
| 2008/0203908 A1 | 8/2008 | Hasegawa et al. | |
| 2009/0058268 A1 | 3/2009 | Yoshida et al. | |
| 2009/0309486 A1 | 12/2009 | Imai et al. | |

FOREIGN PATENT DOCUMENTS

| | | |
|---|---|---|
| JP | 2003-203771 A | 7/2003 |
| JP | 2005-209356 A | 8/2005 |
| JP | 2005-222778 A | 8/2005 |
| JP | 2005-302336 A | 10/2005 |
| JP | 2006-004917 A | 1/2006 |
| JP | 2007-123173 A | 5/2007 |
| JP | 2007-123174 A | 5/2007 |
| JP | 2007-184251 A | 7/2007 |
| JP | 2007-220646 A | 8/2007 |
| JP | 2007-273094 A | 10/2007 |
| JP | 4106076 B2 | 6/2008 |
| JP | 2008-153004 A | 7/2008 |
| JP | 2008-210665 A | 9/2008 |
| WO | WO-02/17689 A1 | 2/2002 |

*Primary Examiner* — Anthony Ho
(74) *Attorney, Agent, or Firm* — Rabin & Berdo, P.C.

(57) ABSTRACT

An organic EL device has an organic EL element provided on a substrate and includes a lower electrode, an organic EL layer, an upper electrode, and a protective layer for moisture protection, and a protective substrate laminated onto the organic EL element via an adhesive layer. The protective layer is a laminated body including first through nth layers, in order, from a side close to the upper electrode (where n is an integer equal to or greater than 3). Each layer of the protective layer includes silicon oxynitride or silicon nitride, and two adjacent layers layer have different chemical compositions. The first layer has a refractive index smaller than that of the upper electrode and the nth layer has a refractive index larger than that of the adhesive layer. The refractive index (k) of the kth layer satisfies a relationship: refractive index $(k-1)$>refractive index $(k)$.

6 Claims, 5 Drawing Sheets

ORGANIC EL DEVICE AND METHOD OF MANUFACTURING SAME

BACKGROUND OF THE INVENTION

1. Field of the Invention

This invention relates to an organic EL device which is useful in display applications, and to a method of manufacturing such an organic EL device. More specifically, this invention relates to an organic EL device that prevents intrusion of water from the outside environment and exhibits excellent light emission efficiency over long periods of time, and to a method of manufacturing such an organic EL device.

2. Description of the Related Art

In display applications in recent years, there has been active research on organic EL devices employing light-emitting organic EL elements. Organic EL devices are expected to achieve high light emission brightness and light emission efficiency. This is because high current densities can be achieved at low voltages. In particular, high hopes are being placed in the display engineering field on high-definition multicolor light-emitting organic EL devices capable of multicolor display and in particular full-color display.

In addition to the realization of high-definition display, the attainment of long-term stability, including color reproducibility, is an important problem for the commercialization of organic EL displays as color display devices. However, multicolor light-emitting organic EL displays have the drawback of suffering marked degradation of light emission characteristics (current-brightness characteristics) as a result of driving over a fixed period.

The growth of dark spots are a representative cause of this decline in light emission characteristics. A "dark spot" is a light emission point defect. Such dark spots are thought to occur due to progressive oxidation or agglomeration of material in a layer comprised by an organic EL element during driving or during storage, due to oxygen or water within the element. Dark spot growth occurs not only when current is passed, but during storage as well. In particular, dark spot growth is thought to (1) be accelerated by oxygen or water existing in the outer environment surrounding the element, (2) be affected by oxygen or water exiting as adsorbed material in a constituent layer, and (3) be affected by water adsorbed by components used in device manufacture, or by the intrusion of water at the time of manufacture. If this growth continues, dark spots spread over the entire light-emitting face of the organic EL device.

As means of the prior art to prevent intrusion of water into constituent layers of organic EL elements, methods in which the organic EL element is sealed using metal housings or glass plates, or methods in which a desiccant is arranged within the space in which the organic EL element is sealed, have been employed. However, in order to take advantage of the light weight and thin shape which are features of organic EL devices, technology for sealing using thin films without employing desiccants has attracted attention.

As thin films for sealing, silicon nitride, silicon oxynitride and the like are used. However, in order to suppress damage to the light-emitting layer during film deposition of these materials, temperature increases at the film deposition surface must at least be suppressed to the glass transition temperature of the light-emitting layer or below. For this reason, film deposition methods which have been developed as part of semiconductor processes cannot be applied to organic EL devices, and there is the problem that a thin film for sealing, having adequate moisture exclusion properties, cannot be formed.

On the other hand, in Japanese Patent Application Laid-open No. 2005-209356, a silicon oxynitride film formed by a sputtering method or a plasma CVD method is proposed as a thin film for sealing that can be applied to organic EL devices (see Japanese Patent Application Laid-open No. 2005-209356). In Japanese Patent Application Laid-open No. 2005-209356, in order to achieve both high gas barrier properties and high optical transmissivity, the use of a gradient silicon oxynitride film the composition of which is changed continuously and in a gradient, and the use of a two-layer layered film of a silicon oxynitride film and a silicon nitride film, are disclosed.

And, in Japanese Patent Application Laid-open No. 2005-222778, a layered film of a silicon nitride film having compressive stress and a silicon nitride film having tensile stress is proposed as a thin film for sealing that can be applied to organic EL devices (see Japanese Patent Application Laid-open No. 2005-222778). In Japanese Patent Application Laid-open No. 2005-222778, the ability to control the magnitudes of the compressive stress and tensile stress, and the ability to control the refractive index of silicon nitride film by means of the number of Si—H bonds formed in silicon nitride film are disclosed. However, because the main bonds in silicon nitride films formed in the layered film are Si—N bonds, the change in lattice constants between the layers is small, defects in the layer serving as the substrate are carried over, and so there is the problem that silicon nitride film containing defects is formed.

In recent years, in order to improve the aperture ratio of organic EL devices employing active matrix driving, so-called top-emission structure devices, in which light is emitted from the opposite side of the substrate on which switching circuitry comprising TFTs and the like is fabricated, have become the mainstream. In this structure, transparent electrodes and sealing film are formed on the organic EL layer, and light emitted from the organic EL layer passes through the sealing film and is emitted to the outside. The refractive indices of the ITO and IZO used in the upper electrodes are approximately 2, and there is a large difference with the refractive indices of the adhesion layer and protective substrate formed in the direction of the outside air and direction of light emission. In Japanese Patent Application Laid-open No. 2005-209356, the refractive index of the sealing film in the direction of light propagation is not stipulated, and so there is the drawback that transmissivity is low.

Further, when using a method in which the proportion of film deposition gas is changed continuously during the process of deposition of the protective film, because of the continuous growth of interfaces and other film defects formed due to differences in the film growth direction arising from misalignment of the atomic order, step formation and the like, such film defects may cause local declines in moisture exclusion properties.

Accordingly, an object of this invention is to provide an organic EL device having long-term stability through the use of a protective layer having high visible-light transmissivity and excellent moisture exclusion properties. A further object of this invention is to provide a method of manufacturing the above-described organic EL device.

SUMMARY OF THE INVENTION

This invention provides an organic EL device, comprising: (a) a substrate; (b) an organic EL element formed on the substrate and including, in order: a lower electrode; an organic EL layer; an upper electrode, and a protective layer that is a laminated body including a first layer through an nth layer, in order, from a side close to the upper electrode, where n is an integer equal to or greater than 3, wherein each layer in the protective layer is comprised of silicon oxynitride or silicon nitride, and two adjacent layers in the protective layer have different chemical compositions, wherein the first layer of the protective layer has a refractive index that is smaller than that of the upper electrode, and the nth layer of the protective layer has a refractive index that is larger than that of the adhesive layer, and wherein, for each integer, k, from 2 to n, the refractive index (k) of the kth layer of the protective layer satisfies a relationship: refractive index (k−1)>refractive index (k); and (c) a protective substrate laminated onto the organic EL element via an adhesive layer.

This invention provides a method of manufacturing an organic EL device as described above, the method comprising the steps of: (a) forming an organic EL element on a substrate by forming, in order, a lower electrode, an organic EL layer, an upper electrode, and a protective layer; and (b) laminating a protective substrate onto the organic EL element via an adhesive layer; wherein the protective layer is formed as a laminated body and includes a first layer through an nth layer, in order, from a side close to the upper electrode, where n is an integer equal to or greater than 3, wherein each layer in the protective layer comprises silicon oxynitride or silicon nitride, and two adjacent layers in the protective layer have different chemical compositions, wherein the first layer of the protective layer is caused to have a refractive index that is smaller than that of the upper electrode and the nth layer of the protective layer is caused to have a refractive index that is larger than that of the adhesive layer, wherein, for each integer, k, from 2 to n, the refractive index (k) of the kth layer of the protective layer is caused to satisfy a relationship: refractive index (k−1)>refractive index (k), wherein each of the layers of the protective layer is formed by a plasma CVD method, using as raw material gases monosilane, ammonia, nitrous oxide ($N_2O$), and nitrogen, with a flow ratio of ammonia gas to monosilane gas ranging from 0.5 up to but less than 1.0, and a flow ratio of nitrous oxide gas to monosilane gas ranging from 0 up to but less than 0.8, and wherein, for each integer, k, from 2 to n, when forming the kth layer of the protective layer, a flow (k) of nitrous oxide gas is caused to satisfy a relationship: flow rate (k−1)<flow rate (k).

The method of manufacturing an organic EL device may further comprise, in said step of forming the organic EL element, for each integer, k, from 2 to n, upon completion of formation of the k−1th layer of the protective layer, halting electric discharge and gas introduction, introducing gas for formation of the kth layer, and then reinitiating electric discharge.

This invention additionally provides an organic EL device, comprising: (a) a substrate; (b) an organic EL element formed on the substrate and including, in order: a lower electrode; an organic EL layer; an upper electrode; and a protective layer that is a laminated body and includes a first layer through an nth layer, in order, from a side close to the upper electrode, where n is an integer equal to or greater than 3, wherein each layer in the protective layer comprises silicon oxynitride or silicon nitride, and two adjacent layers in the protective layer have different chemical compositions, wherein, for each integer, k, from 2 to n, a stretching-mode peak of Si—O bonds to Si—N bonds in the kth layer of the protective layer, has an area ratio denoted as Si—O/Si—N area ratio (k) that is determined by measurement of an infrared absorption spectrum and that satisfies a relationship: Si—O/Si—N area ratio (k−1) <Si—O/Si—N area ratio (k), and the nth layer in the protective layer has an Si—O/Si—N area ratio (n) that is 0.8 or less; and wherein, for each integer, m, from 1 to n, a stretching-mode peak of N—H bonds to Si—N bonds in the mth layer of the protective layer has an area ratio denoted as N—H/Si—N area ratio (m) that is determined by measurement of the infrared absorption spectrum and that is less than 0.1; and (c) a protective substrate laminated onto the organic EL element via an adhesive layer.

This invention additionally provides a method of manufacturing an organic EL device as described above, the method comprising the steps of: (a) forming an organic EL element on a substrate by forming, in order, a lower electrode, an organic EL layer, an upper electrode, and a protective layer; and (b) laminating a protective substrate onto the organic EL element via an adhesive layer; wherein the protective layer is a laminated body that includes a first layer through an nth layer, in order, from a side close to the upper electrode, where n is an integer equal to or greater than 3, wherein each layer in the protective layer comprises silicon oxynitride or silicon nitride, and two adjacent layers in the protective layer have different chemical compositions, wherein, for each integer, k, from 2 to n, a stretching-mode peak of Si—O bonds to Si—N bonds in the kth layer of the protective layer is caused to have an area ratio denoted as Si—O/Si—N area ratio (k), determined by measurement of an infrared absorption spectrum, that satisfies a relationship: Si—O/Si—N area ratio (k−1) <Si—O/Si—N area ratio (k), and for the nth layer in the protective layer the Si—O/Si—N area ratio (n) is caused to be 0.8 or lower, and wherein, for each integer, m, from 1 to n, a stretching-mode peak of N—H bonds to Si—N bonds in the mth layer of the protective layer is caused to have an area ratio denoted as N—H/Si—N area ratio (m), determined by measurement of the infrared absorption spectrum, that is caused to be less than 0.1, wherein each of the layers of the protective layer is formed by a plasma CVD method, using, as raw material gases, monosilane, ammonia, nitrous oxide ($N_2O$), and nitrogen, with a flow ratio of ammonia gas to monosilane gas ranging from 0.5 up to but less than 1.0, and with a flow ratio of nitrous oxide gas to monosilane gas ranging from 0 up to but less than 0.8, and wherein for each integer, k, from 2 to n, a flow (k) of nitrous oxide gas when forming the kth layer of the protective layer is caused to satisfy a relationship: flow rate (k−1)<flow rate (k).

The additional method of manufacturing an organic EL device may further comprise, in said step of forming the organic EL element, for each integer, k, from 2 to n, upon completion of formation of the k−1th layer of the protective layer, halting electric discharge and gas introduction, introducing gas for formation of the kth layer, and then reinitiating electric discharge.

In the circumstances of recent years in which there is a need to develop organic EL displays with higher light-emission efficiencies, this invention can provide an organic EL device which can maintain excellent light-emission efficiency over long periods by using a protective layer having excellent moisture exclusion properties. Further, because a protective layer of this invention has high visible-light transmissivity, a configuration of this invention is especially effective in top-emission organic EL devices.

DETAILED DESCRIPTION OF THE INVENTION

Figure 1:
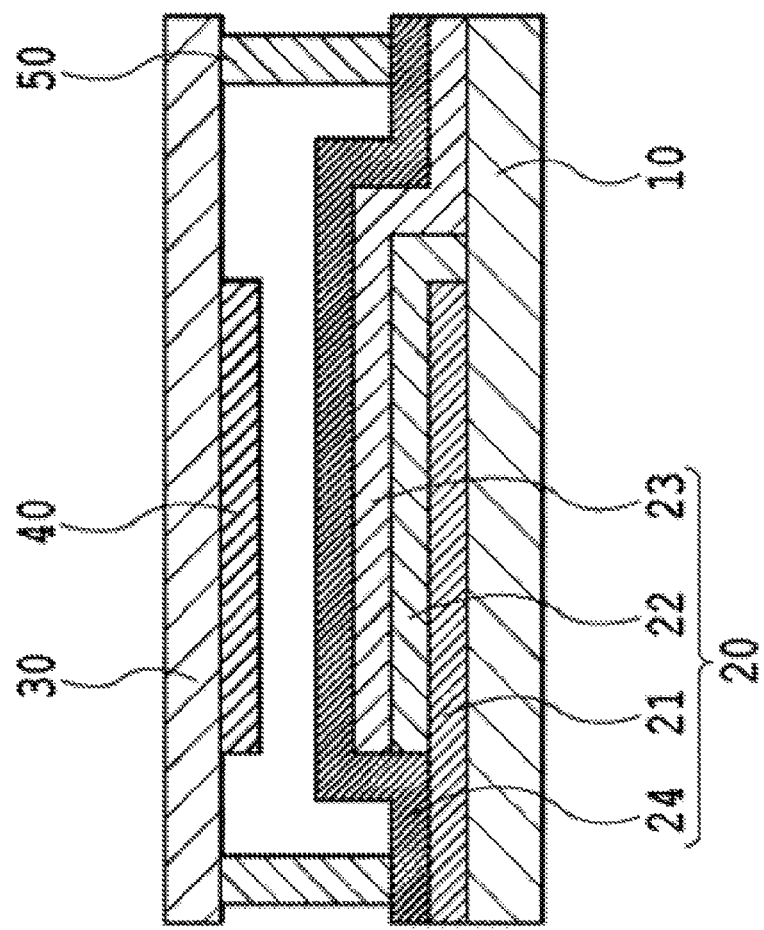
FIG. 1 is a cross-sectional view showing an example of an organic EL device of this invention.

FIG. 1 shows an example of an organic EL device of this invention. An organic EL device of this invention comprises a substrate 10, organic EL element 20 formed on the substrate 10, and protective substrate 30 laminated onto the organic EL element 20 with an adhesive layer 50 intervening; the organic EL element 20 comprises a lower electrode 21, organic EL layer 22, upper electrode 23 and protective layer 24, and the protective layer 24 is a laminated body comprising a first layer to an nth layer from a side close to the upper electrode 23, where n is an integer greater than or equal to 3; each layer in the protective layer 24 comprises silicon oxynitride or silicon nitride, and two adjacent layers in the protective layer 24 have different chemical compositions; the first layer of the protective layer 24 has a refractive index smaller than that of the upper electrode 23, and the nth layer of the protective layer 24 has a refractive index larger than that of the adhesive layer 50; and, for each integer k from 2 to n, the refractive index (k) of the kth layer of the protective layer 24 satisfies the relation refractive index (k−1)>refractive index (k). In FIG. 1, an example is shown in which a protective substrate 30 on which is placed a color-converting color layer 40 is used, with the organic EL element 20 and the color-converting color layer 40 positioned in opposition.

Further, an organic EL device of this invention comprises a substrate 10, an organic EL element 20 formed on the substrate 10, and a protective substrate 30 laminated onto the organic EL element 20 with an adhesive layer 50 intervening, and is characterized in that the organic EL element 20 comprises a lower electrode 21, an organic EL layer 22, an upper electrode 23 and a protective layer 24; the protective layer 24 is a laminated body comprising a first layer through an nth layer, in order from a side close to the upper electrode 23, where n is an integer equal to or greater than 3; each of the layers in the protective layer 24 comprises silicon oxynitride or silicon nitride, and two adjacent layers in the protective layer have different chemical compositions; for each integer k from 2 to n, the area ratio of stretching-mode peak of Si—O bonds to Si—N bonds in the kth layer in the protective layer 24, i.e. Si—O/Si—N area ratio (k), determined by measurement of the infrared absorption spectrum, satisfies the relation Si—O/Si—N area ratio (k−1)<Si—O/Si—N area ratio (k); for the nth layer in the protective layer 24, the Si—O/Si—N area ratio (n) is 0.8 or lower, and moreover for each integer m from 1 to n, the peak area ratio of N—H bonds to Si—N bonds in the mth layer in the protective layer 24, i.e. N—H/Si—N area ratio (m), determined by measurement of the infrared absorption spectrum, is less than 0.1.

The above-described organic EL device can be manufactured by a method comprising a process of forming in order the lower electrode 21, organic EL layer 22, upper electrode 23 and protective layer 24 on the substrate 10, to form the organic EL element 20, and a process of laminating the protective substrate 30 onto the organic EL element 20 with the adhesive layer 50 intervening. In this method, each of the layers forming the protective layer 24 uses monosilane, ammonia, nitrous oxide ($N_2O$) and nitrogen as raw material gases, and layers are formed by a plasma CVD method, with the flow ratio of ammonia gas to monosilane gas at 0.5 or higher and less than 1.0, and the flow ratio of nitrous oxide to monosilane gas at 0 or higher and less than 0.8. In this method, for each integer k from 2 to n, the flow (k) of nitrous oxide gas when forming the kth layer of the protective layer 24 satisfies the relation flow rate (k−1)<flow rate (k).

In the above method, it is desirable that, for each integer k from 2 to n, at the time of the end of formation of the k−1th layer in the protective layer, discharge and gas introduction be halted, gas introduction for formation of the kth layer be performed, and discharge then be started, to clarify the interface between two adjacent layers in the protective layer.

The substrate 10 in this invention can be formed using an arbitrary material which can withstand the various conditions of formation of the other constituent layers (for example, solvents used, temperatures, and similar). It is desirable that the substrate 10 have excellent dimensional stability. Transparent materials for use in forming the substrate 10 include glass, or polyolefins, polymethyl methacrylate or other acrylic resins, polyethylene terephthalate or other polyester resins, polycarbonate resins, polyimide resins, and other resins. When using the above-described resins, the substrate 10 may be rigid, or may be flexible. Or, in the case of the top-emission organic EL device shown in FIG. 1, the substrate 10 may be formed using silicon, a ceramic, or another opaque material. The substrate 10 can be formed using a flat material having insulating properties and rigidity sufficient to hold the form of the organic EL light-emitting element.

The substrate 10 may further comprise, on the surface thereof, a plurality of switching elements (TFTs or the like), wiring, and other components. This configuration is effective for manufacture of active-matrix driven organic EL devices having a plurality of independent light-emitting portions.

The lower electrode 21 positioned between the substrate 10 and the organic EL layer 22, and the upper electrode 23 positioned on the side of the organic EL layer 22 opposite the substrate 10, have the function of connecting with circuits for carrier injection into the organic EL layer 22 and for external driving. The lower electrode 21 and upper electrode 23 may respectively be either positive (hole-injection electrode) or negative (electron-injection electrode). Either the lower electrode 21 or the upper electrode 23 is a positive electrode, and the other is a negative electrode. In the top-emission structure shown in FIG. 1, it is desirable that the lower electrode 21 be a reflective electrode, and that the upper electrode 23 be a transparent electrode.

The reflective electrode used as the lower electrode 21 can be formed using a metal with high reflectivity (aluminum, silver, molybdenum, tungsten, nickel, chromium, or the like) or an alloy of these, or using an amorphous alloy (NiP, NiB, CrP, CrB, or the like). It is particularly preferable that the composition of a silver alloy be established from the standpoint of being able to obtain a reflectivity for visible light of 80% or higher. Silver alloys which can be used include alloys of silver with at least one metal selected from the group comprising nickel or platinum in group 10, rubidium in group 1, and lead in group 14, or an alloy of silver with at least one metal selected from the group comprising magnesium and calcium in group 2.

The transparent electrode used as the upper electrode 23 can be formed using $SnO_2$, $In_2O_3$, In—Sn oxide, In—Zn oxide, ZnO, Zn—Al oxide, or another conductive metal oxide. Because the transparent electrode is a path for extraction of emitted light from the organic EL layer 22 to the outside, it is desirable that the transmissivity be 50% or higher in the wavelength range of 400 through 800 nm, and preferable that the transmissivity be 85% or higher.

The lower electrode 21 and upper electrode 23 can be formed using a resistive heating or electron beam heating evaporation deposition method, or a sputtering method. When using an evaporation deposition method, film deposition is possible at a rate of 0.1 through 10 nm/second under a pressure of $1.0 \times 10^{-4}$ Pa or lower. On the other hand, when using DC magnetron sputtering or another sputtering method, Ar or another inert gas can be used as the sputtering gas, and film deposition can be performed under a pressure of approximately 0.1 through 2.0 Pa. When forming the upper electrode 23 using a sputtering method, in order to prevent degradation of the organic EL layer 22, which is the surface of the substrate for film deposition, it is preferable that the organic EL layer 22 not be directly irradiated by plasma formed in proximity to the target.

The organic EL layer 22 is positioned between the lower electrode 21 and the upper electrode 23, and is in contact with both the electrodes. This layer is the core of the light emission portion. The organic EL layer 22 comprises at least a light-emitting layer, and as necessary comprises a hole transport layer, hole injection layer, electron transport layer, and/or electron injection layer. For example, the organic EL layer 22 can have the following kinds of layer configurations.

(1) Positive electrode/light-emitting layer/negative electrode.

(2) Positive electrode/hole injection layer/light-emitting layer/negative electrode.

(3) Positive electrode/light-emitting layer/electron injection layer/negative electrode.

(4) Positive electrode/hole injection layer/light-emitting layer/electron injection layer/negative electrode.

(5) Positive electrode/hole transport layer/light-emitting layer/electron injection layer/negative electrode.

(6) Positive electrode/hole injection layer/hole transport layer/light-emitting layer/electron injection layer/negative electrode.

(7) Positive electrode/hole injection layer/hole transport layer/light-emitting layer/electron transport layer/electron injection layer/negative electrode In the above configurations (1) through (7), one of the positive electrode and the negative electrode is the lower electrode 21 and other is the upper electrode 23.

The light-emitting layer can be formed using well-known materials. Materials to obtain emission of blue to blue-green light include, for example, fluorescent whiteners such as benzothiazole compounds, benzo imidazole compounds, and benzo oxazole compounds; metal chelate oxonium compounds such as aluminum complexes, of which the tris-(8-hydroxyquinolinato) aluminum complex ($Alq_3$) is representative; styryl benzene compounds such as 4,4'-bis (diphenylvinyl) biphenyl (DPVBi); aromatic dimethylidine compounds; condensed aromatic ring compounds; ring correlated compounds; porphyrin compounds; and similar.

Or, by adding dopants to host compounds, light-emitting layers can be formed which emit light in various wavelength ranges. In this case, as the host compound, a distyryl allylene compound, N,N'-ditolyl-N,N'-diphenylbiphenylamine (TPD), $Alq_3$ or similar can be used. On the other hand, as the dopant, perylene (blue-purple), coumarin 6 (blue), quinacridone compound (blue-green to green), rubrene (yellow), 4-dicyanomethylene-2-(p-dimethylaminostyryl)-6-methyl-4H-pyrane (DCM, red), platinum octaethylporphyrin complex (PtOEP, red), or the like can be used.

A hole transport layer can be formed using a material having a triarylamine partial structure, carbazole partial structure, or oxadiazole partial structure. Preferred materials for a hole transport layer include TPD, 4,4'-bis[N-(1-naphthyl)-N-phenylamino] biphenyl (α-NPD), MTDAPB(o-,m-,p-), m-MTDATA, and the like. A hole injection layer can be formed using a material comprising copper phthalocyanine complex (CuPc) or another phthalocyanine (Pc), indanthrene compounds, or the like.

An electron transport layer can be formed using an aluminum complex such as $Alq_3$, PBD, TPOB, or another oxadiazole derivative, a triazole derivative such as TAZ, a triamine derivative, a phenylquinoxaline, a thiophene derivative such as BMB-2T, or a similar material. An electron injection layer can be formed using an aluminum complex such as $Alq_3$, or an aluminum quinolinol complex doped with an alkali metal or an alkali earth metal, or a similar material.

In addition to the above-described constituent layers, a buffer layer (not shown) to further heighten the carrier injection efficiency can be formed, arbitrarily selectively, between the organic EL layer 22 and either the lower electrode 21 or the upper electrode 23 used as the negative electrode. A buffer layer can be formed using an alkali metal, alkali earth metal or an alloy of these, or a rare-earth metal, or a metal fluoride or other electron injection material.

Further, it is preferable that a damage alleviation layer (not shown), comprising MgAg or the like, be formed on the upper surface of the organic EL layer 22 in order to alleviate damage at the time of formation of the upper electrode 23.

It is important that each layer comprised by the organic EL layer 22 have thickness sufficient to realize the desired characteristics. In this invention, it is desirable that a light-emitting layer, hole transport layer, electron transport layer, and electron injection layer have thicknesses in the range of 2 to 50 nm, and that a hole injection layer have a thickness in the range of 2 to 200 nm. Further, it is preferable that an arbitrarily selected buffer layer have a thickness of 10 nm or less, from the standpoints of driving voltage reduction and improvement of transparency.

Each of the constituent layers of the organic EL layer 22, a buffer layer and a damage alleviation layer can be fabricated using arbitrary well-known means of the technology, such as evaporation deposition (resistive-heating evaporation deposition or electron beam-heating evaporation deposition) or the like.

The protective layer 24 is a layer provided to prevent intrusion of water from the outer environment or from a layer which may contain water, into an electrode and/or the organic EL layer 22. The protective layer 24 comprises three or more inorganic film layers; each of the inorganic films is a silicon nitride film or a silicon oxynitride film. Two adjacent inorganic films (layers) in the protective layer have different chemical compositions. And, it is desirable that the refractive indices of the upper electrode 23, the inorganic films comprised by the protective layer 24, and the adhesive layer 50 become smaller in moving from the upper electrode 23 toward the adhesive layer 50. That is, it is desirable that, when the protective layer 24 is taken to be a laminated body from the first layer close to the upper electrode 23 to the nth layer (where n is an integer greater than or equal to 3), and when the refractive index of the kth layer is "refractive index (k)", the refractive indices satisfy the following relations:

(1) (refractive index of upper electrode 23)>refractive index (1);

(2) refractive index (n)>(refractive index of adhesive layer 50); and, (3) for each integer k from 2 to n, refractive index (k−1) >refractive index (k).

Hence the refractive indices of the inorganic films comprised by the protective layer 24 are within the range from the refractive index of the adhesive layer 50 (normally approximately 1.6) to the refractive index of the upper electrode 23 (normally approximately 2.1).

It is desirable that inorganic films comprised by the protective layer 24 have low stress, in order to prevent film separation. In this invention, it is desirable that the stress in inorganic films, whether compressive or tensile, have an absolute value of 20 MPa or less. The stress can be determined by for example forming the inorganic film on a Si wafer, and determining the amount of change of warping of the Si wafer before and after inorganic film formation.

In particular, in a top-emission structure such as that shown in FIG. 1, the protective layer 24 is positioned in the path of emission of light from the organic EL layer to the outside, so that high transmissivity for visible light is desirable. Specifically, it is desirable that the extinction coefficient of the film in the wavelength range from 400 through 800 nm be smaller than 0.001.

Figure 2:
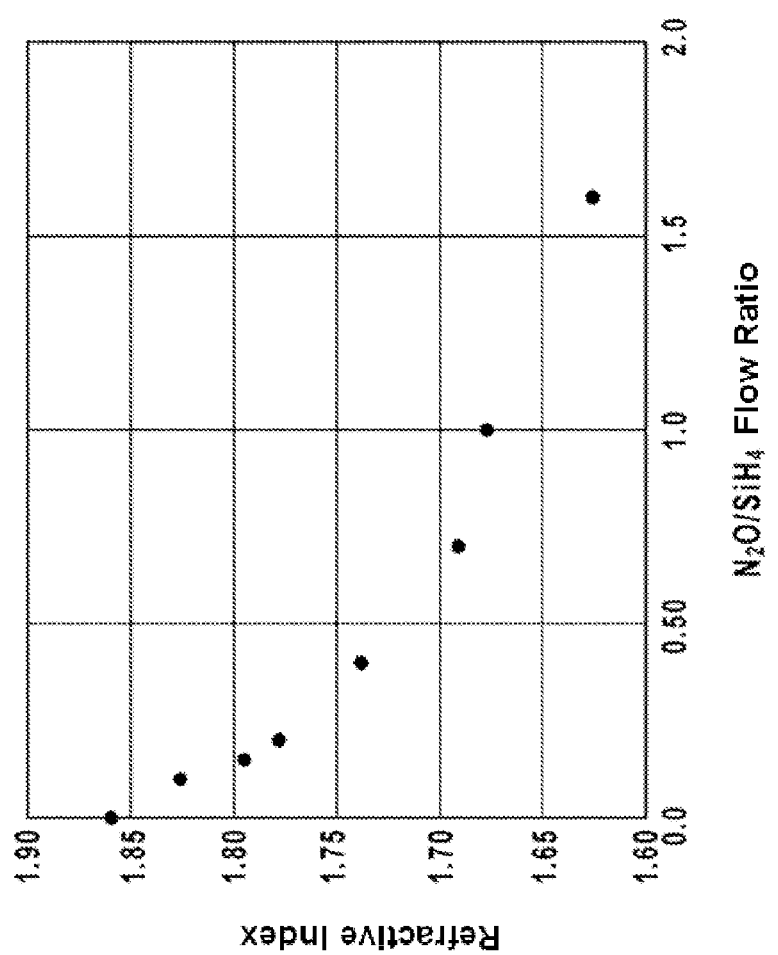
FIG. 2 shows changes in refractive index with the flow ratio of nitrous oxide gas to monosilane gas.

Silicon nitride films and silicon oxynitride films comprised by the protective layer 24 can be formed using the chemical vapor deposition (CVD) method. In particular, it is desirable that plasma CVD be used, employing monosilane, ammonia, nitrous oxide and nitrogen as raw material gases and applying high-frequency power. Here, when forming a silicon nitride film, nitrous oxide is not used. In order to obtain the above-described refractive indices, the flow rate of ammonia gas relative to monosilane gas is set to 0.5 or greater and less than 1.0. When forming silicon nitride film without using nitrous oxide, if the above-described ammonia/monosilane flow ratio is used, silicon nitride film with a refractive index of approximately 1.8 to 1.9 is obtained. In order to lower the refractive index, nitrous oxide gas is introduced at a flow rate relative to monosilane gas of from 0 to 0.8. When using nitrous oxide, a silicon oxynitride film is formed, and as the nitrous oxide/monosilane gas flow ratio is increased, the refractive index of the silicon oxynitride film obtained declines. FIG. 2 shows the relation between the nitrous oxide/monosilane flow ratio and the refractive index at wavelength 450 nm (see Manufacturing Example 1).

In order to obtain silicon nitride film and silicon oxynitride film with good moisture exclusion properties, it is desirable that the frequency of the high-frequency power be set to 25 MHz or higher and 50 MHz or lower. It is still more preferable that high-frequency power at a frequency of 27.12 MHz or 40.68 MHz be used. Also, it is desirable that the power density of the high-frequency power be 0.1 through 2 W/cm$^2$. From the standpoint of avoiding damage to the substrate 10 or to layers already formed on the substrate 10, it is preferable that silicon nitride film or silicon oxynitride film be formed at a substrate temperature of 70° C. or lower.

It is important that each of the layers comprised by a protective layer 24 of this invention have a clear interface. In other words, it is important that two adjacent layers in the protective layer 24 (silicon nitride film or silicon oxynitride film) have different chemical compositions. A clear interface provides resistance against moisture diffusion, and is useful for improving moisture exclusion properties. Hence when formation of one layer ends, it is desirable that the discharge and introduction of raw material gas be stopped, and that new raw material gas for formation of the next layer be introduced and discharge induced. For example, when the protective layer 24 is a laminated body comprising a first layer through an nth layer (where n is an integer greater than or equal to 3) from a side close to the upper electrode 23, for integers k from 2 to n, it is desirable that at the time formation of the k−1th layer in the protective layer ends the discharge and introduction of raw material gas be stopped, the raw material gas for formation of the kth layer (having components or a flow ratio different from that used to form the k−1th layer) be introduced, and discharge then be started.

In this invention description, "chemical composition" of silicon nitride film and silicon oxynitride film comprised by the protective layer 24 means the peak area ratios of Si—N bonds, Si—O bonds, and N—H bonds, rather than the molar ratios of Si, N and O in the film. When in this invention the protective layer 24 is a laminated body comprising a first through an nth layer (where n is an integer equal to or greater than 3) from side close to the upper electrode 23, it is desirable that, for each integer k from 2 to n, the area ratio of the stretching-mode peak of Si—O bonds to Si—N bonds in the kth layer of the protective layer, denoted as Si—O/Si—N area ratio (k), as determined from infrared absorption spectra measurements, satisfy the relation Si—O/Si—N area ratio (k−1) <Si—O/Si—N area ratio (k). Also, it is desirable that the nth layer Si—O/Si—N area ratio (n) be 0.8 or lower. In other words, for each integer m from 1 to n, it is desirable that Si—O/Si—N area ratio (m) 0.8 be satisfied. In addition, for each integer m from 1 to n, it is desirable that the area ratio of stretching-mode peak of N—H bonds to Si—N bonds in the mth layer of the protective layer, denoted as N—H/Si—N area ratio (m), as determined from infrared absorption spectra measurements, be less than 0.1.

In order to achieve the relations for refractive index and chemical composition explained above, when in this invention the protective layer 24 is a laminated body comprising a first through an nth layer (where n is an integer equal to or greater than 3) from a side close to the upper electrode 23, it is desirable that for each integer k from 2 to n, the flow (k) of nitrous oxide when forming the kth layer satisfy the relation flow (k−1)<flow (k).

The method of deciding the Si—O/Si—N area ratio in this invention is explained. First, the IR spectrum of the silicon oxynitride film is measured. In this invention, the IR spectrum uses stretching-mode absorption. Absorption in this mode is preferable because of the strong intensity and ease of peak separation. Also, this spectrum is represented using as the horizontal axis a linear scale for the wavenumber (units: cm$^{-1}$), with no partial enlargement or the like. In order to eliminate background absorption, it is desirable that the IR spectra of the film substrate with the silicon oxynitride film formed and of the film substrate without the silicon oxynitride film formed be measured, and that the difference in spectra be taken.

Figure 3:
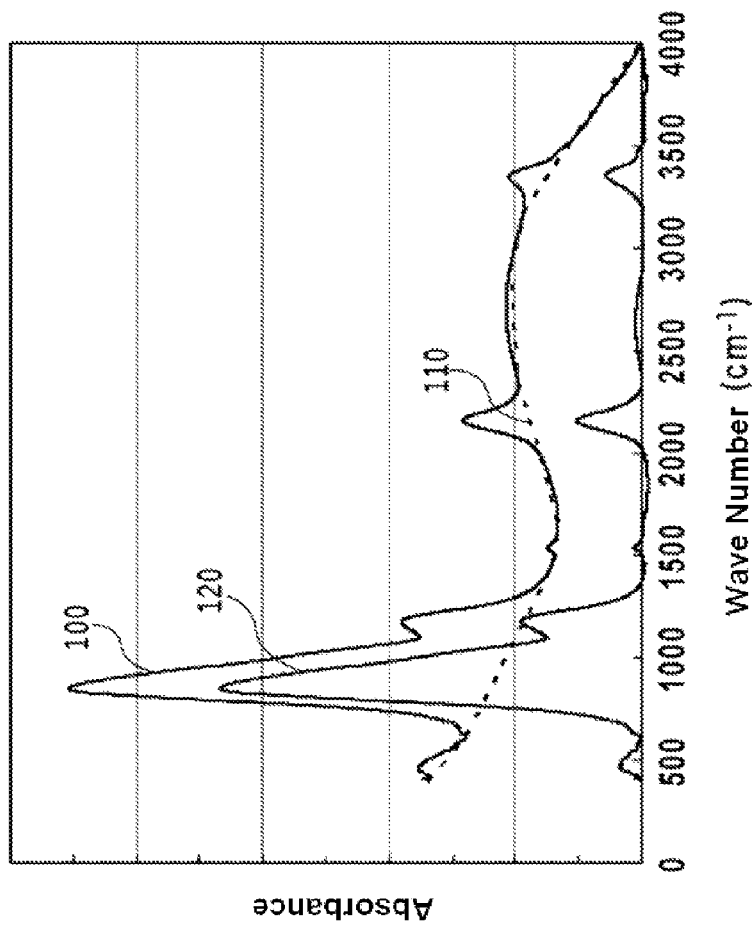
FIG. 3 shows IR spectra used to decide the ratios of Si—O bonds and Si—N bonds in silicon nitride film.

The IR spectrum obtained contains fluctuations in absorbance due to optical interference in the film. In order to eliminate this fluctuation in absorbance, correction using a baseline is performed. FIG. 3 explains this correction process, and shows the as-measured IR spectrum 100, baseline 110, and IR spectrum after baseline correction 120. In this invention, the baseline for a silicon oxynitride film is obtained by using straight lines to connect absorbance of the IR spectrum 100 at the wavenumbers stipulated as follows: 400, 612, 1500, 1650, 2030, 2330, 2900, 3200, 3550, 4000 (cm$^{-1}$).

At each wavenumber, the absorbance of the baseline 110 is subtracted from the absorbance of the IR spectrum 100, to obtain the IR spectrum after baseline correction 120.

Next, peak separation is performed for the IR spectrum after baseline correction 120. Peak separation is performed by representing each peak using the Gaussian function $G_n$ expressed by equation (I).

$$G_n = A_n \exp(-B_n(x-C_n)^2) \qquad (I)$$

Figure 4:
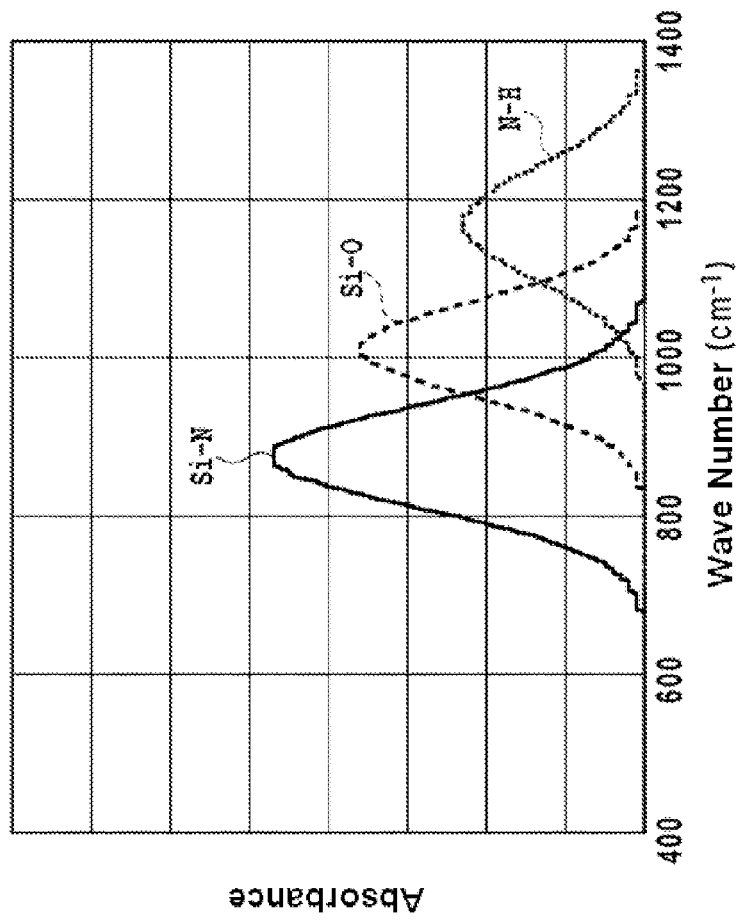
FIG. 4 shows IR spectra after peak separation, used to decide the ratios of Si—O bonds and Si—N bonds in silicon nitride film; and, FIG. 5 shows changes in infrared absorption spectra with the flow ratio of nitrous oxide gas.

In this equation, $A_n$ is the maximum value of the absorbance for each peak, $C_n$ is the wavenumber (in cm$^{-1}$ units) at which the absorbance is maximum for each peak, x is the wavenumber, and $B_n$ is a variable. Using the least-mean squares method, $B_n$ is determined for each peak. That is, peaks are separated such that the sum of the square of the difference between the sum of the Gaussian function $G_n$ and the IR spectrum after baseline correction 120 is minimum. FIG. 4 shows the result of peak separation of the IR spectrum after baseline correction 120 in FIG. 3.

In this invention, peaks having maxima at 830 through 870 cm$^{-1}$ are taken to be peaks indicating the stretching mode of Si—N bonds, peaks having maxima at 970 through 1070 cm$^{-1}$ are taken to be peaks indicating the stretching mode of Si—O bonds, and peaks having maxima at 3250 through 3400 cm$^{-1}$ are taken to be peaks indicating the stretching mode of N—H bonds.

Finally, the Gaussian function $G_n$ for each peak obtained by peak separation is integrated, the absorption areas for Si—N bonds, Si—O bonds, and N—H bonds are determined, and these are used to determine the Si—O/Si—N area ratio and the N—H/Si—N area ratio.

The protective substrate 30 can be formed using for example a polyolefin, polymethyl methacrylate, or another acrylic resin, polyethylene terephthalate or another polyester resin, polycarbonate resin, or a resin such as polyimide resin. When using a resin, the protective substrate 30 may be rigid, or may be flexible.

The color-converting color layer 40 is a layer to adjust the hue of light emitted from the organic EL layer 22. In this invention description, a "color-converting color layer" is a general term for a color layer, a color-converting layer, or a laminated body of a color layer and a color-converting layer. The color-converting color layer 40 may be provided on the inside of the protective substrate 30 shown in FIG. 1, or, a structure is conceivable in which the layer is provided on the outside of the protective substrate 30.

A color layer is a layer which transmits light in a specific wavelength region. A color layer has the function of improving the color purity of light from the organic EL layer 22 or from a color-converting layer. A color layer can be formed using a commercially marketed color material for flat panel displays (for example Color Mosaic manufactured by Fuji Film Electronic Materials). Spin coating, roll coating, casting, dip coating, or other application methods can be used to form color layers. Film formed by an application method may be patterned using photolithography or another method to form a color layer having a desired pattern.

A color-converting layer is a layer which absorbs light in a specific wavelength region and performs wavelength distribution conversion, to output light in a different wavelength region. A color-converting layer comprises at least a fluorescent dye, and may comprise a matrix resin as necessary. The fluorescent dye absorbs light from the organic EL layer 22, and emits light in the desired wavelength region (for example, the red region, green region, or blue region).

Fluorescent dyes which absorb light from the blue to the blue-green regions and emit fluorescent light in the red region include, for example, rhodamine B, rhodamine 6G, rhodamine 3B, rhodamine 101, rhodamine 110, sulfo rhodamine, basic violet 11, basic red 2, and other rhodamine dyes; cyanine dyes; 1-ethyl-2-[4-(p-dimethylaminophenyl)-1,3-butadienyl]-pyridinium-perchlorate (pyridine 1) and other pyridine dyes; and oxazine dyes. Or, various dyes having the above-described fluorescent properties (direct dyes, acid dyes, base dyes, disperse dyes, and the like) may be used.

Fluorescent dyes which absorb light from the blue to the blue-green region and emit fluorescent light in the green region include, for example, 3-(2'-benzothiazolyl)-7-diethylamino coumarin (coumarin 6), 3-(2'-benzoimidazolyl)-7-diethylanimo coumarin (coumarin 7), 3-(2'-N-methylbenzoimidazolyl)-7-diethylamino coumarin (coumarin 30), 2,3,5,6-1H,4H-tetrahydro-8-trifluoromethyl quinolizine (9,9a,1-gh) coumarin (coumarin 153), and other coumarin dyes; solvent yellow 11, solvent yellow 116, and other naphthalimide dyes; and, basic yellow 51 and other coumarin dyestuffs. Or, various dyes having the above-described fluorescent properties (direct dyes, acid dyes, base dyes, disperse dyes, and the like) may be used.

As matrix resins for color-converting layers, acrylic resins, various silicone polymers, or any arbitrary material which can be substituted for these can be used. For example, as matrix resins, straight-type silicone polymers and denatured resin type silicon polymers can be used.

A color-converting layer can be formed using spin coating, roll coating, casting, dip coating, or other application methods, or by using an evaporation deposition method. When forming a color-converting layer using a plurality of types of fluorescent dyes, the plurality of fluorescent dyes are mixed with a matrix resin in prescribed ratios to form a preparatory mixture, and this preparatory mixture can be used in evaporation deposition. Or, a co-evaporation deposition method may be used to form a color-converting layer. A co-evaporation deposition method is employed by forming a plurality of mixtures for evaporation deposition by mixing the plurality of types of fluorescent dyes with respective matrix resins, arranging the mixtures for evaporation deposition at separate heating positions, and then separately heating the mixtures for evaporation deposition. In particular, when the characteristics (evaporation deposition rate and/or vapor pressure or the like) of the plurality of types of fluorescent dyes differ greatly, use of the co-evaporation deposition method is advantageous.

When using a color-converting color layer 40 comprising a color-converting layer, a passivation layer (not shown) may be formed covering the entirety of the color-converting color layer 40, in order to prevent degradation of the color-converting layer characteristics. A passivation layer can be formed using insulating oxides ($SiO_x$, $TiO_2$, $ZrO_2$, $AlO_x$, and the like) and insulating nitrides ($AlN_x$, $SiN_x$, and the like). A passivation layer can be formed using a method such as plasma CVD. From the standpoint of preventing degradation of the color-converting layer, when forming a passivation layer it is desirable that the temperature of the film substrate the uppermost layer of which is the color-converting color layer 40 be 100° C. or lower.

The adhesive layer 50 is a layer used when laminating the protective substrate 30 and the substrate 10. The adhesive layer 50 can for example be formed using a thermosetting adhesive, UV-hardening adhesive, UV-thermosetting adhesive, or the like. Adhesives which can be used include epoxy resin adhesives. The above-described adhesive may comprise spacer particles to delimit a distance between the substrate 10 and the protective substrate 30. Spacer particles which can be used include glass beads and the like. The adhesive layer 50 can be formed by applying the adhesive to prescribed positions on the surface of either the substrate 10 or the protective substrate 30, laminating the substrate 10 and the protective substrate 30, and hardening the adhesive. It is desirable that the refractive index of the adhesive layer be in the range greater than 1.5 and smaller than 1.8.

FIG. 1 shows an example of an organic EL device comprising a single light-emitting portion. However, an organic EL device of this invention may comprise a plurality of independently controlled light-emitting portions. For example, a so-called passive-matrix driven organic EL device may be formed, with the lower electrodes and upper electrodes as electrode groups comprising a plurality of stripe-shape electrodes, and with the direction of extension of the stripe-shape electrodes comprising the lower electrodes caused to intersect with the direction of extension of the stripe-shape electrodes comprising the upper electrodes. In a display application which displays arbitrary images and/or characters, it is preferable that the direction of extension of the stripe electrodes comprising lower electrodes, and the direction of extension of the stripe electrodes comprising upper electrodes, intersect perpendicularly. Or, the lower electrodes may be divided into a plurality of partial electrodes, each of the plurality of partial electrodes may be connected one-to-one with switching elements formed on the substrate, and the upper electrodes may be an integrated common electrode, to form a so-called active matrix-driven organic EL device.

In the cases of either a passive matrix-driven device or an active matrix-driven device, it is desirable that an insulating film be provided between the plurality of partial electrodes comprising lower electrodes. An insulating film can be formed using insulating oxides ($SiO_x$, $TiO_2$, $ZrO_2$, $AlO_x$, and the like), insulating nitrides ($AlN_x$, $SiN_x$, and the like), or polymer materials.

In a configuration having a plurality of independently controlled light-emitting portions, a plurality of types of color-converting layers can be used to form an organic EL device capable of multicolor display. For example, red, green, and blue color-converting layers can be used to configure red, green, and blue subpixels, and by a matrix arrangement of pixels each comprising a set of subpixels in three colors, an organic EL device capable of full-color display can be formed.

EMBODIMENTS

Manufacturing Example 1

In this manufacturing example, with the monosilane flow at 100 sccm, the nitrogen flow at 2000 sccm, and the ammonia flow fixed at 80 sccm, the flow of nitrous oxide was varied in the range 0 through 160 sccm. At this time, the pressure of the gas mixture was 100 Pa. Using high-frequency power at frequency 27.12 MHz and a power density of 0.5 $W/cm^2$, silicon nitride film or silicon oxynitride film was formed on substrates for film deposition at 50° C. In this manufacturing example, silicon nitride film and silicon oxynitride film are referred to generally as "SiNOx film".

(1) Si—O/Si—N Area Ratio, N—H/Si—N Area Ratio

Figure 5:
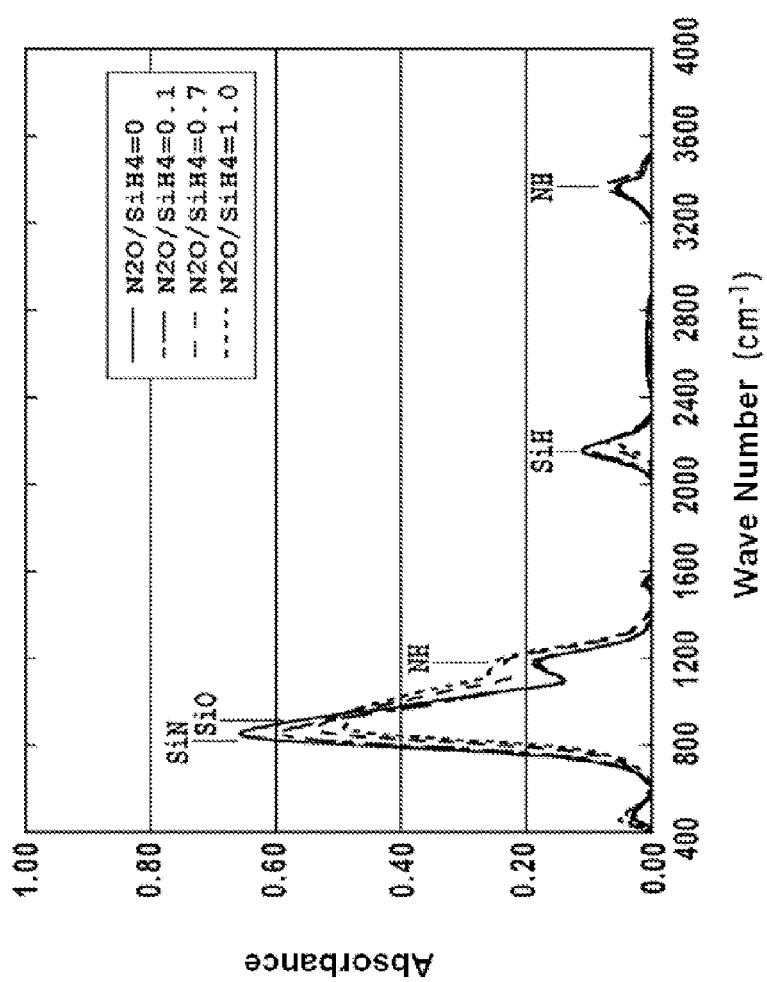

As the substrate for film deposition, Si wafers of thickness 0.5 mm were used, and SiNOx film of thickness 1 μm was formed. The IR spectrum of the SiNOx film obtained was measured using a transmission-type Fourier transform infrared spectrometer. In order to eliminate background absorption due to the Si wafer, Si wafers in the same lot were used as reference, and the difference spectrum between the SiNOx film/Si wafer laminated body and the Si wafer was measured. Next, baseline determination and baseline correction were performed as described above. The spectrum shape is shown in FIG. 5. Thereafter peak separation was performed, the absorption areas for Si—N bonds, Si—O bonds, and N—H bonds were determined, and the Si—O/Si—N area ratio and N—H/Si—N area ratio were determined. Results appear in Table 1.

(2) Measurement of Refractive Index and Extinction Coefficient

As the substrate for film deposition, Si wafers were used, and SiNOx film of thickness 1 μm was formed. A spectroscopic ellipsometer (VASE, manufactured by J.A. Woollam Co., Inc.) was used to measure the refractive index and extinction coefficient of the SiNOx film obtained. Changes in refractive index at wavelength 475 nm appear in FIG. 2. With addition of nitrous oxide the refractive index declines, and was approximately 1.68 at a flow of 100 sccm.

(3) Moisture Exclusion Properties

SiNOx film of thickness 3 μm was formed so as to cover a calcium film of thickness 100 nm. Samples obtained were left for 1000 hours in a thermostatic chamber at 95° C. and 50% RH, the area of alteration of the calcium film was measured, and moisture exclusion properties were evaluated for each film.

The calcium film was initially opaque. However, upon reaction of calcium with moisture, primarily in the atmosphere, calcium hydroxide was produced, and the reacted portion of the film became transparent. Photographic observations of 500 μm×500 μm areas were made, binary quantization as "transparent" or "opaque" of photographed areas were made, and the area of unaltered portions, in which there was no change to transparency, was calculated as a percentage. Photographed regions were sample center portions, in which there was least variation in film thickness. The results appear in Table 1.

(4) Film Stress

Si wafers of diameter 4 inches (approximately 10.2 cm) were used as substrates for film deposition. Prior to film deposition, warping of the Si wafers was measured. Then, SiNOx film of thickness 3 μm was formed, and Si wafer warping after film deposition was measured. From the change in Si wafer warping before and after deposition, the film stress in the SiNOx film was calculated. The results appear in Table 1.

TABLE 1

Characteristics of silicon nitride films and silicon oxynitride films

| Sample number | $N_2O$ flow (sccm) | Si—O/Si—N area ratio | N—H/Si—N area ratio | Refractive index | Unaltered portion area ratio (%) | Extinction coefficient ($\times 10^{-4}$) | Film stress (MPa) |
|---|---|---|---|---|---|---|---|
| 1 | 0 | 0 | 0.08 | 1.86 | 96 | 2 | 7 |
| 2 | 10 | 0.05 | 0.05 | 1.83 | 98 | 0 | 7 |
| 3 | 15 | 0.1 | 0.06 | 1.80 | 97 | 0 | 6 |
| 4 | 20 | 0.2 | 0.07 | 1.78 | 96 | 0 | 6 |
| 5 | 40 | 0.4 | 0.08 | 1.74 | 94 | 0 | 5 |
| 6 | 70 | 0.8 | 0.09 | 1.69 | 90 | 0 | 5 |
| 7 | 100 | 1.0 | 0.10 | 1.68 | 72 | 0 | 5 |
| 8 | 160 | 2.0 | 0.16 | 1.63 | 54 | 0 | 4 |

From Table 1, moisture exclusion properties were substantially equal for films formed with nitrous oxide flows of 0 through 20 sccm, but as the amount of nitrous oxide added was increased, a tendency for moisture exclusion properties to decline was observed. When the amount of nitrous oxide added exceeded 20 sccm, the N—H/Si—N area ratio increased, and so it is inferred that in order to control moisture exclusion properties, the protective film must be formed under film deposition conditions which reduce the ratio of N—H bonds in the film. Areas in which the unaltered portion area was maintained at 90% or higher are thought to be suitable as protective films.

Embodiment 1

In this embodiment, a red light-emitting organic EL device with 2×2 pixels, with pixels measuring 0.3 mm×0.3 mm, was fabricated.

As the substrate 10, fusion glass (Corning 1737 glass, 50×50×1.1 mm) was prepared. A sputtering method was used to deposit an Ag film of thickness 100 nm on the substrate 10. The Ag film thus obtained was patterned using photolithography to form lower electrodes 21 comprising two stripe-shape electrodes, of width 0.3 mm.

Next, the substrate 10 with the lower electrodes 21 formed was installed in a resistive-heating evaporation deposition device. Through evaporation deposition using a mask, a buffer layer comprising Li of film thickness 1.5 nm was formed on the lower electrodes 21. Then, evaporation deposition was used to form an organic EL layer 22 comprising four layers, which were an electron transport layer/light-emitting layer/hole transport layer/hole injection layer. The electron transport layer was $Alq_3$ with a film thickness of 20 nm; the light-emitting layer was DPVBi with a film thickness of 30 nm; the hole transport layer was α-NPD with a film thickness of 10 nm; and the hole injection layer was CuPc with a film thickness of 100 nm. When depositing the organic EL layer 22, the pressure within the vacuum chamber of the device was $1\times10^{-4}$ Pa, and each layer was formed at a film deposition rate of 0.1 nm/s. Then, evaporation deposition was used to form an MgAg film 5 nm thick, as a damage alleviation layer.

Next, the laminated body with the damage alleviation layer formed was transferred to an opposed sputtering device without breaking the vacuum. IZO was deposited to a film thickness of 100 nm by a sputtering method using a metal mask, to form transparent upper electrodes 23. The upper electrodes 23 comprised two stripe-shape electrodes, 0.3 mm in width, extending in the direction perpendicularly intersecting the stripe-shape electrodes of the lower electrodes 21. The upper electrodes 23 had a refractive index of 2.10 at wavelength 475 nm.

Next, the laminated body with the upper electrodes 23 formed was transferred to a plasma CVD device, and a three-layer protective layer 24 was formed. The first layer was formed using as the raw material a gas mixture of 100 sccm monosilane, 80 sccm ammonia, and 2000 sccm nitrogen, applying high-frequency power at a frequency of 27.12 MHz and a power density of 0.5 W/cm$^2$, to form a silicon nitride film of thickness 500 nm (sample 1 of Manufacturing Example 1). At this time, the pressure within the device during film deposition was 100 Pa, and the temperature of the stage holding the substrate for film deposition was 50° C. The second layer was a silicon oxynitride film of thickness 500 nm (sample 2 of Manufacturing Example 1), formed using the conditions for formation of the first layer but with 10 sccm nitrous oxide added. The third layer was a silicon oxynitride film of thickness 500 nm (sample 4 of Manufacturing Example 1), formed using the conditions for formation of the first layer but with 20 sccm nitrous oxide added. Through the above processes, an organic EL element 20 was formed, comprising lower electrodes 21/organic EL layer 22/upper electrodes 23/protective layer 24 on the substrate 10. The organic EL element 20 obtained was transferred into a lamination device, the internal environment of which was adjusted to an oxygen concentration of 5 ppm or less and a water concentration of 5 ppm or less.

TABLE 2

Characteristics of constituent layers of organic EL device

| Constituent layer | | Refractive index | Si—O/Si—N area ratio | N—H/Si—N area ratio | N$_2$O flow (sccm) |
|---|---|---|---|---|---|
| Upper electrodes | | 2.10 | — | — | — |
| Protective layer | First layer | 1.86 | 0 | 0.08 | 0 |
| | Second layer | 1.83 | 0.05 | 0.05 | 10 |
| | Third layer | 1.78 | 0.2 | 0.07 | 20 |
| Adhesive layer | | 1.60 | — | — | — |

Separately, fusion glass (Corning 1737 glass, 50×50×1.1 mm) was prepared as a protective substrate 30. Red color material (Color Mosaic CR7001 (manufactured by FujiFilm Electronic Materials)) was applied onto the protective substrate 30, and patterning was performed, so that red color layers comprising four portions, of dimensions 0.5 mm×0.5 mm, were formed in positions equivalent to the pixels of the organic EL element 20. The red color layers had a thickness of 1.5 μm.

Next, the protective substrate 30 with red color layers formed was installed in a resistive-heating evaporation deposition device. Evaporation deposition was used to deposit a red color-converting layer, of thickness 300 nm and comprising coumarin 6 and DCM-2, on the red color layers. The coumarin 6 and DCM-2 were each heated in separate crucibles, with the evaporation deposition rate of the coumarin 6 set to 0.3 nm/s and the evaporation deposition rate of the DCM-2 set to 0.005 nm/s. The molar ratio of coumarin 6 to DCM-2 in the red color-converting layer was 49:1. Through the above processes, a protective substrate 30 having a red color-converting color layer 40 was formed. The protective substrate 30 obtained was transferred into the above-described lamination device.

Next, inside the lamination device, epoxy UV-hardening adhesive was dripped onto the outer periphery of the surface of the protective substrate 30 on which was formed the red color-converting color layer 40, and thermosetting adhesive (OGSOL SI-20 (manufactured by Osaka Gas Chemicals Co., Ltd.)) was dripped onto the red color-converting color layer 40. With the red color-converting color layer 40 and the organic EL element 20 opposed, and with the positions of the red color-converting color layer 40 corresponding to the pixels of the organic EL element 20, the substrate 10 on which was formed the organic EL element 20 and the protective substrate 30 on which was formed the red color layer 40 were temporarily bonded. Then, the pressure within the lamination device was reduced to approximately 10 MPa, to laminate the substrate 10 and the protective substrate 30. After the end of lamination, the pressure within the lamination device was raised to atmospheric pressure.

Next, only the UV-hardening resin on the outer periphery of the protective substrate 30 was irradiated with ultraviolet rays using a mask, to temporarily harden the adhesive. Then, the laminated member was heated at 80° C. for 1 hour in a heating furnace to harden the adhesive, forming the adhesive layer 50, to obtain the organic EL device. After the end of heating, the organic EL device was naturally cooled for 30 minutes in the heating furnace, and then removed from the heating furnace. The adhesive layer 50 formed on the organic EL element 20 from thermosetting adhesive (OGSOL SI-20 (manufactured by Osaka Gas Chemicals Co., Ltd.)) had a refractive index of 1.60.

Comparison Example 1

Except for the fact that a silicon nitride film (sample 1 of Manufacturing Example 1) of thickness 1500 nm was formed as the protective layer 24, the procedure of Embodiment 1 was repeated to form an organic EL device. That is, using as the raw material a gas mixture of 100 sccm monosilane, 80 sccm ammonia, and 2000 sccm nitrogen, applying high-frequency power at a frequency of 27.12 MHz and a power density of 0.5 W/cm$^2$, a silicon nitride film of thickness 1500 nm was formed, to form the organic EL device.

Comparison Example 2

Except for the fact that a silicon oxynitride film (sample 4 of Manufacturing Example 1) of thickness 1500 nm was formed as the protective layer 24, the procedure of Embodiment 1 was repeated to form an organic EL device. That is, using as the raw material a gas mixture of 100 sccm monosilane, 80 sccm ammonia, 20 sccm nitrous oxide, and 2000 sccm nitrogen, applying high-frequency power at a frequency of 27.12 MHz and a power density of 0.5 W/cm$^2$, a silicon oxynitride film was formed, to form the organic EL device.

Comparison Example 3

Except for the fact that the order of formation of the three layers comprised by the protective layer 24 was reversed from that of Embodiment 1, the procedure of Embodiment 1 was repeated to form an organic EL device. That is, from the side of the upper electrodes 23, a silicon oxynitride film (sample 4 of Manufacturing Example 1) of thickness 500 nm, a silicon oxynitride film (sample 2 of Manufacturing Example 1) of thickness 500 nm, and a silicon nitride film (sample 1 of Manufacturing Example 1) of thickness 500 nm were formed. The thickness of the protective layer 24 in this comparison example was 1500 nm.

The organic EL devices obtained in Embodiment 1 and Comparison Examples 1 through 3 were placed in an environment at 60° C. and 90% RH, current was passed at a current density of 0.1 A/cm$^2$ to drive the devices continuously over 1000 hours, and the voltage and brightness were measured. The brightness was divided by the current value to determine the light emission efficiency. Taking the light emission efficiency of the organic EL device of Embodiment 1 to be 1, the initial light emission efficiencies and the light emission efficiencies after 1000 hours of continuous driving of the organic EL devices of Embodiment 1 and the comparison examples were determined. The results appear in Table 3.

TABLE 3

Long-term stability of organic EL devices

| | Light emission efficiency | |
| --- | --- | --- |
| | Initial | After 1000 hours of continuous driving |
| Embodiment 1 | 1 | 0.8 |
| Comparison Example 1 | 0.9 | 0.5 |
| Comparison Example 2 | 0.9 | 0.4 |
| Comparison Example 3 | 0.7 | 0.6 |

As is clear from Table 3, the devices of Comparison Examples 1 through 3 initially exhibited light emission efficiencies inferior to that of the device of Embodiment 1. This is attributed to the fact that the differences in refractive indices between the protective layer 24 and the adhesive layer 50 in the devices of Comparison Examples 1 through 3 are greater than the refractive index difference for Embodiment 1. As a result, it is thought, a portion of the light emitted from the organic EL layer 22 is reflected by the protective layer 24, so that the light emission efficiency is reduced.

Further, it is seen that the light emission efficiency after 1000 hours of continuous driving is significantly reduced for the devices of Comparison Examples 1 and 2, compared with that of Embodiment 1. It is thought that the light emission efficiencies of the devices of the comparison examples declined due to the intrusion of water through the protective layer 24, as a result of the fact that the protective layer 24 is a single layer.

FIG. 2
REFRACTIVE INDEX
$N_2O/SiH_4$ FLOW RATIO
FIG. 3
ABSORBANCE
WAVENUMBER (cm$^{-1}$)
FIG. 4
ABSORBANCE
WAVENUMBER (cm$^{-1}$)
FIG. 5
ABSORBANCE
WAVENUMBER (cm$^{-1}$)

The invention claimed is:

1. An organic EL device, comprising:
    a. a substrate;
    b. an organic EL element formed on the substrate and including, in order:
        a lower electrode;
        an organic EL layer;
        an upper electrode, and
        a protective layer that is a laminated body including a first layer through an nth layer, in order, from a side close to the upper electrode, where n is an integer equal to or greater than 3,
        wherein each layer in the protective layer is comprised of silicon oxynitride or silicon nitride, and two adjacent layers in the protective layer have different chemical compositions,
        wherein the first layer of the protective layer has a refractive index that is smaller than that of the upper electrode, and the nth layer of the protective layer has a refractive index that is larger than that of the adhesive layer, and
        wherein, for each integer, k, from 2 to n, the refractive index (k) of the kth layer of the protective layer satisfies a relationship: refractive index (k−1)> refractive index (k); and
    c. a protective substrate laminated onto the organic EL element via an adhesive layer.

2. An organic EL device, comprising:
    a. a substrate;
    b. an organic EL element formed on the substrate and including, in order:
        a lower electrode;
        an organic EL layer;
        an upper electrode; and
        a protective layer that is a laminated body and includes a first layer through an nth layer, in order, from a side close to the upper electrode, where n is an integer equal to or greater than 3, wherein each layer in the protective layer comprises silicon oxynitride or silicon nitride, and two adjacent layers in the protective layer have different chemical compositions, wherein, for each integer, k, from 2 to n, a stretching-mode peak of Si—O bonds to Si—N bonds in the kth layer of the protective layer, has an area ratio denoted as Si—O/Si—N area ratio (k) that is determined by measurement of an infrared absorption spectrum and that satisfies a relationship: Si—O/Si—N area ratio (k−1) <Si—O/Si—N area ratio (k), and the nth layer in the protective layer has an Si—O/Si—N area ratio (n) that is 0.8 or less; and wherein, for each integer, m, from 1 to n, a stretching-mode peak of N—H bonds to Si—N bonds in the mth layer of the protective layer has an area ratio denoted as N—H/Si—N area ratio (m) that is determined by measurement of the infrared absorption spectrum and that is less than 0.1; and c. a protective substrate laminated onto the organic EL element via an adhesive layer.

3. A method of manufacturing an organic EL device, comprising the steps of:
 a. forming an organic EL element on a substrate by forming, in order, a lower electrode, an organic EL layer, an upper electrode, and a protective layer; and
 b. laminating a protective substrate onto the organic EL element via an adhesive layer;
  wherein the protective layer is formed as a laminated body and includes a first layer through an nth layer, in order, from a side close to the upper electrode, where n is an integer equal to or greater than 3,
  wherein each layer in the protective layer comprises silicon oxynitride or silicon nitride, and two adjacent layers in the protective layer have different chemical compositions;
  wherein the first layer of the protective layer is caused to have a refractive index that is smaller than that of the upper electrode and the nth layer of the protective layer is caused to have a refractive index that is larger than that of the adhesive layer;
  wherein, for each integer, k, from 2 to n, the refractive index (k) of the kth layer of the protective layer is caused to satisfy a relationship: refractive index (k−1)> refractive index (k);
  wherein each of the layers of the protective layer is formed by a plasma CVD method, using as raw material gases monosilane, ammonia, nitrous oxide (N$_2$O), and nitrogen, with a flow ratio of ammonia gas to monosilane gas ranging from 0.5 up to but less than 1.0, and a flow ratio of nitrous oxide gas to monosilane gas ranging from 0 up to but less than 0.8; and
  wherein, for each integer, k, from 2 to n, when forming the kth layer of the protective layer, a flow (k) of nitrous oxide gas is caused to satisfy a relationship: flow rate (k−1) <flow rate (k).

4. The method of manufacturing an organic EL device according to claim 3, further comprising, in said step of forming the organic EL element, for each integer, k, from 2 to n, upon completion of formation of the k−1th layer of the protective layer, halting electric discharge and gas introduction, introducing gas for formation of the kth layer, and then reinitiating electric discharge.

5. A method of manufacturing an organic EL device, comprising the steps of:
 a. forming an organic EL element on a substrate by forming, in order, a lower electrode, an organic EL layer, an upper electrode, and a protective layer; and
 b. laminating a protective substrate onto the organic EL element via an adhesive layer;
  wherein the protective layer is a laminated body that includes a first layer through an nth layer, in order, from a side close to the upper electrode, where n is an integer equal to or greater than 3,
  wherein each layer in the protective layer comprises silicon oxynitride or silicon nitride, and two adjacent layers in the protective layer have different chemical compositions;
  wherein, for each integer, k, from 2 to n, a stretching-mode peak of Si—O bonds to Si—N bonds in the kth layer of the protective layer is caused to have an area ratio denoted as Si—O/Si—N area ratio (k), determined by measurement of an infrared absorption spectrum, that satisfies a relationship: Si—O/Si—N area ratio (k−1) <Si—O/Si—N area ratio (k), and for the nth layer in the protective layer the Si—O/Si—N area ratio (n) is caused to be 0.8 or lower; and
  wherein, for each integer, m, from 1 to n, a stretching-mode peak of N—H bonds to Si—N bonds in the mth layer of the protective layer is caused to have an area ratio denoted as N—H/Si—N area ratio (m), determined by measurement of the infrared absorption spectrum, that is caused to be less than 0.1;
  wherein each of the layers of the protective layer is formed by a plasma CVD method, using, as raw material gases, monosilane, ammonia, nitrous oxide (N$_2$O), and nitrogen, with a flow ratio of ammonia gas to monosilane gas ranging from 0.5 up to but less than 1.0, and with a flow ratio of nitrous oxide gas to monosilane gas ranging from 0 up to but less than 0.8; and
  wherein for each integer, k, from 2 to n, a flow (k) of nitrous oxide gas when forming the kth layer of the protective layer is caused to satisfy a relationship: flow rate (k−1) < flow rate (k).

6. The method of manufacturing an organic EL device according to claim 5, further comprising, in said step of forming the organic EL element, for each integer, k, from 2 to n, upon completion of formation of the k−1th layer of the protective layer, halting electric discharge and gas introduction, introducing gas for formation of the kth layer, and then reinitiating electric discharge.

* * * * *